United States Patent
Rubin et al.

(10) Patent No.: US 11,114,410 B2
(45) Date of Patent: Sep. 7, 2021

(54) MULTI-CHIP PACKAGE STRUCTURES FORMED BY JOINING CHIPS TO PRE-POSITIONED CHIP INTERCONNECT BRIDGE DEVICES

(71) Applicant: International Business Machines Corporation, Armonk, NY (US)

(72) Inventors: Joshua M. Rubin, Albany, NY (US); Steven Lorenz Wright, Tucson, AZ (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 16/697,682

(22) Filed: Nov. 27, 2019

(65) Prior Publication Data

US 2021/0159211 A1    May 27, 2021

(51) Int. Cl.
*H01L 23/00* (2006.01)
*H01L 21/02* (2006.01)
*H01L 21/56* (2006.01)

(52) U.S. Cl.
CPC ........ *H01L 24/96* (2013.01); *H01L 21/02013* (2013.01); *H01L 21/02016* (2013.01); *H01L 21/561* (2013.01); *H01L 21/563* (2013.01); *H01L 24/03* (2013.01); *H01L 24/05* (2013.01); *H01L 24/11* (2013.01); *H01L 2224/02371* (2013.01); *H01L 2924/18162* (2013.01)

(58) Field of Classification Search
None
See application file for complete search history.

(56) References Cited

U.S. PATENT DOCUMENTS

| | | | |
|---|---|---|---|
| 7,681,309 B2 | 3/2010 | Miller | |
| 8,901,748 B2 | 12/2014 | Manusharow et al. | |
| 9,252,128 B2 | 2/2016 | Chandrasekaran | |
| 9,607,966 B2 | 3/2017 | Prueckl | |
| 9,761,513 B2 | 9/2017 | Yee et al. | |
| 10,032,748 B2 | 7/2018 | Hiner et al. | |
| 2017/0271307 A1* | 9/2017 | Hiner | H01L 24/95 |
| 2018/0308789 A1* | 10/2018 | Zhao | H01L 24/96 |
| 2019/0043792 A1* | 2/2019 | Weerasekera | H01L 23/5389 |

FOREIGN PATENT DOCUMENTS

| | | |
|---|---|---|
| WO | 2017164810 A1 | 9/2017 |
| WO | 2018009145 A1 | 1/2018 |

\* cited by examiner

*Primary Examiner* — Khaja Ahmad
(74) *Attorney, Agent, or Firm* — Jeffrey S LaBaw; Ryan, Mason & Lewis, LLP

(57) ABSTRACT

Techniques are provided for constructing multi-chip package structures using pre-positioned interconnect bridge devices that are fabricated on a bridge wafer. For example, integrated circuit chips are mounted to a bridge wafer which is formed to have a plurality of pre-positioned interconnect bridge devices, wherein at least two integrated circuit chips are joined to each interconnect bridge device, and wherein each interconnect bridge device includes wiring to provide chip-to-chip connections between the integrated circuit chips connected to the interconnect bridge device. A wafer-level molding layer is formed on the bridge wafer to encapsulate the integrated circuit chips mounted to the bridge wafer. The interconnect bridge devices are released from the bridge wafer. The wafer-level molding layer is then diced to form a plurality of individual multi-chip modules.

9 Claims, 12 Drawing Sheets

MULTI-CHIP PACKAGE STRUCTURES FORMED BY JOINING CHIPS TO PRE-POSITIONED CHIP INTERCONNECT BRIDGE DEVICES

TECHNICAL FIELD

This disclosure generally relates to semiconductor packaging techniques and, in particular, to techniques for constructing multi-chip package structures.

BACKGROUND

Innovations in semiconductor fabrication and packaging technologies have enabled the development of smaller scale, higher density integrated circuit (IC) dies, as well as the development of highly integrated chip modules with wiring and area array input/output (I/O) contact densities that enable dense packaging of IC dies (alternatively referred to herein as IC chips). For certain applications, high-performance electronic modules are constructed with one or more multi-chip modules (MCMs) mounted to a circuit board (e.g., a system board (or node card), a printed circuit board, a printed wiring board, etc.) using a suitable area array connection technique for module-to-board I/O interconnections (e.g., land grid array (LGA) or ball grid array (BGA) connections). MCM technology can be utilized to form a first level package structure with high-density packaging of multiple IC processor chips for computer server applications, or multiple heterogeneous chips for custom applications, etc.

Various conventional techniques can be utilized to construct an MCM package structure. For example, an MCM can be constructed by connecting multiple semiconductor IC dies directly to a package substrate. The semiconductor IC dies can be connected to a surface of the package substrate using wiring bonding, tape bonding, or flip-chip bonding. For high performance and high-density packages, direct chip attachment (DCA) techniques are commonly used for flip-chip bonding IC dies to the package substrate using area arrays of solder interconnects formed between contact pads on active surfaces of the semiconductor IC dies and matching arrays of contact pads formed on a chip mounting surface (or top-side surface) on the package substrate. The package substrate includes wiring for providing die-to-die connections between IC dies mounted to the top-side of the package substrate, as well as wiring for connecting the top-side contact pads to bottom-side contact pads.

In conventional MCM technologies, the package substrate can be, e.g., a glass-ceramic substrate, or a laminate substrate. For example, a multi-layer ceramic package substrate can be fabricated using low-temperature co-fired ceramic (LTCC) substrate technology. In addition, a laminate package substrate can be fabricated using surface laminate circuit (SLC) technology to produce low-cost organic package substrates with build-up layers that are vertically connected through micro-vias to support solder-bumped flip-chips.

There is a continued demand for IC chips with increasing integrated functionality and smaller footprint sizes, which leads to increases in the I/O count and I/O density of the IC chips. Moreover, high-performance and high-density integrated package solutions typically require small micro-bumps for flip-chip connectivity using contact pitches of, e.g., 50 microns or less, and line width and line spacing design rules of 10 microns or less. While an MCM package structure allows heterogeneous IC dies to be directly connected (e.g., DCA) to each other through the package substrate, conventional ceramic-based package substrate and laminate substrate technologies are limited with regard to the smallest achievable contact pad pitch, line width and line spacing. As such, conventional ceramic and organic laminate build up substrates are a bottleneck to high-density packaging, as such substrate technologies cannot support the tight pitches needed for high-density I/O flip-chip connections and high-density die-to-die interconnections.

To address these limitations, 2.5D packaging techniques are utilized to increase I/O density and provide high-density routing for low power die-to-die communication. In general, 2.5-D integration involves flip-chip bonding multiple IC dies on a passive interposer substrate (e.g., silicon, glass, or fine-pitch organic build substrate), wherein the passive interposer substrate is bonded to the package substrate. As compared to the package substrate, the interposer comprises finer pitch wiring, higher contact pad densities, and shorter distances for die-to-die interconnects.

A silicon interposer for 2.5D packaging consists of a thin layer of silicon which is disposed between the IC dies and the package substrate, and which comprises through-silicon vias (TSVs) to provide a platform with high wiring density for I/O redistribution and die-to-die communication. Silicon interposers require large and expensive silicon chips with TSVs to accommodate multiple chips on the top surface. Unfortunately, silicon interposers are expensive due to the size of the silicon interposer chip needed to accommodate the footprints of multiple dies attached to the surface of the silicon interposer, and due to the use of TSV technology which increases fabrication costs and complexity.

On the other hand, a fine-pitch organic build-up interposer for 2.5D packaging utilizes thin film technology to build fine-pitch organic redistribution layers on top of a conventional organic laminate substrate. While the fine-pitch organic redistribution layers provide a platform with high wiring density for I/O redistribution and die-to-die communication, such technology is limited in the number of fine-pitch redistribution layers and minimum wire pitch that is achievable, as compared to silicon-based interposer solutions.

Other 2.5D packaging solutions utilize silicon bridge devices that are embedded into a package substrate to provide tighter interconnect density between adjacent dies. The silicon bridge devices are lower in cost than conventional silicon interposers as silicon bridge devices are much smaller (they only connect to peripheral regions of adjacent dies) and do not utilize costly TSB's. Although silicon bridge devices are simple in form, conventional bridge devices are designed to only include wiring for die-to-die interconnection, but not wiring for, e.g., vertical power distribution through the bridge device from the package substrate to the dies.

SUMMARY

Embodiments of the disclosure include methods for fabricating multi-chip package structures by joining IC chips or IC chip package structures to pre-positioned interconnect bridge devices that are fabricated on a bridge interconnect wafer, as well as multi-chip package structure formed using such methods.

For example, one embodiment of the disclosure includes a method for constructing a package structure. A plurality of integrated circuit chips are mounted to a bridge wafer comprising a plurality of pre-positioned interconnect bridge devices, wherein at least two integrated circuit chips are joined to each interconnect bridge device, and wherein each interconnect bridge device comprises wiring to provide chip-to-chip connections between the integrated circuit chips connected to the interconnect bridge device. A wafer-level molding layer is formed on the bridge wafer to encapsulate the plurality of integrated circuit chips mounted to the bridge wafer. The interconnect bridge devices are released from the bridge wafer. The wafer-level molding layer is then diced to form a plurality of individual multi-chip modules.

Another embodiment of the disclosure includes a method for constructing a package structure. A wafer-level redistribution layer structure is formed on a surface of a bridge wafer, wherein the bridge wafer comprises a plurality of pre-positioned interconnect bridge devices disposed in a layer of insulating material, and vertical interconnect structures disposed within the layer of insulating material adjacent to the interconnect bridge devices. A plurality of integrated circuit chips are mounted to an upper surface of the wafer-level redistribution layer, wherein the wafer-level redistribution layer structure comprises wiring to provide connections between the integrated circuit chips and the interconnect bridge devices of the bridge wafer, and wiring to provide connections between the integrated circuit chips and the vertical interconnect structures of the bridge wafer. A wafer-level molding layer is formed on the wafer-level redistribution layer structure to encapsulate the plurality of integrated circuit chips mounted to the wafer-level redistribution layer structure. The interconnect bridge devices are released from the bridge wafer. The wafer-level molding layer and wafer-level redistribution layer structure are then diced to form a plurality of individual multi-chip modules.

Another embodiment of the disclosure includes a method for constructing a package structure. The method comprises forming a wafer-level chip package structure comprising a wafer-level redistribution layer structure, a plurality of integrated circuit chips disposed on a surface of the wafer-level redistribution layer structure, and a molding layer formed on the surface of the wafer-level redistribution layer structure encapsulating the integrated circuit chips. The wafer-level chip package structure is joined to a bridge wafer, wherein the bridge wafer comprises a plurality of pre-positioned interconnect bridge devices, and wherein joining the wafer-level chip package structure to the bridge wafer comprises bonding a bottom surface of the wafer-level redistribution layer structure to the interconnect bridge devices using solder bump connections. The interconnect bridge devices are released from the bridge wafer, and the wafer-level chip package structure is diced to form a plurality of individual multi-chip modules.

Another embodiment of the disclosure includes a package structure. The package structure comprises a package substrate and a multi-chip module joined to the package substrate. The multi-chip module comprises a plurality of interconnect bridge devices, and a plurality of integrated circuit chips coupled to the interconnect bridge devices. A spacing between the interconnect bridge devices and an arrangement of the interconnect bridge devices is lithographically defined by formation of the interconnect bridge devices on a bridge wafer and coupling of the integrated circuit chips to the interconnect bridge device before release of the interconnect bridge devices from the bridge wafer.

Other embodiments of the disclosure will be described in the following detailed description of embodiments, which is to be read in conjunction with the accompanying figures.

BRIEF DESCRIPTION OF THE DRAWINGS

FIGS. 3A, 3B, 3C, 3D, 3E, 3F, 3G and 3H schematically illustrate a method for constructing a multi-chip package structure by joining IC chips to pre-positioned interconnect bridge devices that are fabricated on a bridge wafer, according to an embodiment of the disclosure, wherein:

FIG. 3A is a schematic cross-sectional side view of a bridge wafer comprising a plurality of interconnect bridge devices formed on a surface of the bridge wafer;

FIG. 3B is a schematic cross-sectional side view of the bridge wafer 300 of FIG. 3A after forming dicing channels in the surface of the bridge wafer around each of the interconnect bridge devices;

FIG. 3C is a schematic cross-sectional side view of the bridge wafer of FIG. 3B after joining IC chips to the interconnect bridge devices;

FIG. 3D is a schematic cross-sectional side view of the structure shown in FIG. 3C after forming a molding layer to encapsulate the IC chips and cover exposed regions of the upper surface of the bridge wafer;

FIG. 3E is a schematic cross-sectional side view of the structure shown in FIG. 3D after planarizing the upper surface of the molding layer and the backsides of the IC chips to form a planarized surface;

FIG. 3F is a schematic cross-sectional side view of the structure shown in FIG. 3E after bonding a handler substrate to the planarized backside surfaces of the IC chips and the molding layer, and after performing a backside grind process to remove a semiconductor wafer layer of the bridge wafer and release the individual interconnect bridge devices;

FIG. 3G is a schematic cross-sectional side view of the wafer-level structure shown in FIG. 3F after dicing the wafer-level structure to obtain an individual multi-chip module, and aligning the multi-chip module to a package substrate; and FIG. 3H is a schematic cross-sectional side view of a multi-chip package structure that is formed by joining the individual multi-chip module to the upper surface of the package substrate and removing the handler substrate.

FIGS. 4A, 4B, 4C, 4D, and 4E schematically illustrate a method for constructing a multi-chip package structure according to another embodiment of the disclosure, wherein:

FIG. 4A is a schematic cross-sectional side view of the bridge wafer of FIG. 3A after etching trenches in the upper surface of the bridge wafer around the interconnect bridge devices;

FIG. 4B is a schematic cross-sectional side view of the bridge wafer of FIG. 4A after joining IC chips to the interconnect bridge devices;

FIG. 4C is a schematic cross-sectional side view of the structure shown in FIG. 4B after forming an underfill layer to encapsulate metallic pillars and the interconnect bridge devices, and after forming a molding layer to encapsulate the IC chips and cover exposed regions of the etched surface of the bridge wafer;

FIG. 4D is a schematic cross-sectional side view of the structure shown in FIG. 4C after planarizing the upper surface of the structure to thin down the molding layer and make the backside surfaces of the IC chips coplanar, bonding a temporary wafer handler to the planarized surface of the structure, backside grinding the bridge wafer to release the interconnect bridge devices, and after forming solder bumps on exposed ends of the metallic pillars and on exposed bottom surfaces of the interconnect bridge devices; and FIG. 4E is a schematic cross-sectional side view of a multi-chip package structure which is formed by joining a multi-chip module to an upper surface of a package substrate and removing a handler from the upper surface of the multi-chip module.

FIGS. 5A, 5B, and 5C schematically illustrate a method for constructing a multi-chip package structure according to another embodiment of the disclosure, wherein:

FIG. 5A is a schematic cross-sectional side view of the bridge wafer 300 of FIG. 3A after etching trenches in the upper surface of the bridge wafer around the interconnect bridge devices;

FIG. 5B is a schematic cross-sectional side view of the bridge wafer of FIG. 5B after forming an insulating layer to encapsulate the interconnect bridge devices, and after forming vertical interconnects in the insulating layer; and FIG. 5C is a schematic cross-sectional side view of the structure of FIG. 5B after forming a wafer-level redistribution layer structure on the bridge wafer and after joining a plurality of IC chips to the upper surface of the wafer-level redistribution layer structure.

FIGS. 6A and 6B schematically illustrate a method for constructing a multi-chip package structure according to another embodiment of the disclosure, wherein:

FIG. 6A is a schematic cross-sectional side view of a wafer-level chip package structure comprising a wafer-level redistribution layer structure, a plurality of IC chips, and a molding layer which encapsulated the IC chips; and FIG. 6B is a schematic cross-sectional side view of a package structure which is formed by joining the wafer-level chip package structure of FIG. 6A to the bridge wafer of FIG. 3B.

DETAILED DESCRIPTION

Figure 1:
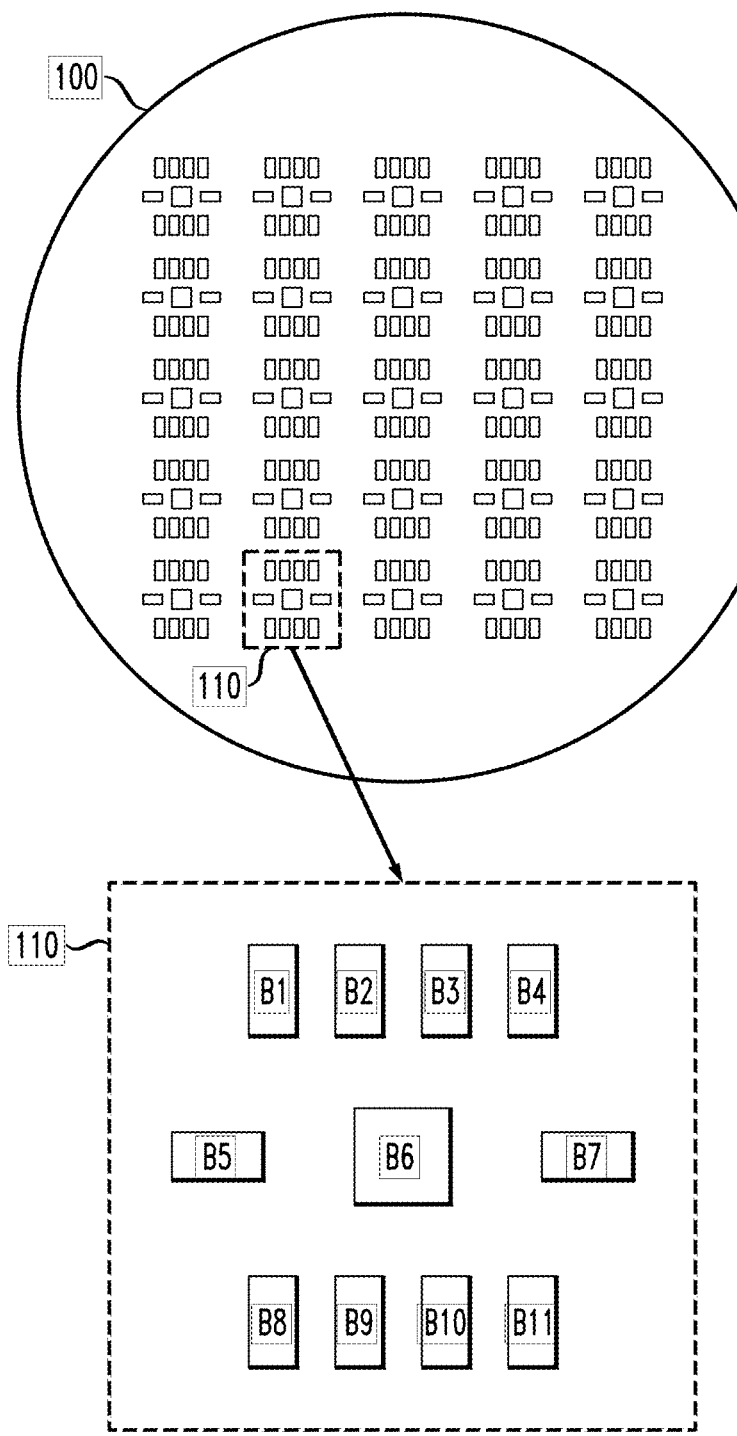
FIG. 1 schematically illustrates a semiconductor wafer which comprises a plurality of pre-positioned bridge interconnect devices formed on a surface of the semiconductor (bridge) wafer, according to an embodiment of the disclosure.

Embodiments of the disclosure will now be discussed in further detail with regard to methods for fabricating multi-chip package structures. As explained in further detail below, a multi-chip package structure is fabricated using a process which comprises joining multiple IC chips to pre-positioned interconnect bridge devices that are fabricated on a bridge wafer. The interconnect bridge devices are designed to provide high I/O interconnect density and high bandwidth signal distributions between two or more individual IC chips that are joined to the interconnect bridge devices. In addition, the interconnect bridge devices may include lateral power distribution wiring through the interconnect bridge device to supply power (and ground) connections between individual IC chips connected to the interconnect bridge devices.

It is to be understood that the various layers, structures, and regions shown in the accompanying drawings are schematic illustrations that are not drawn to scale. In addition, for ease of explanation, one or more layers, structures, and regions of a type commonly used to form devices or package structures may not be explicitly shown in a given drawing. This does not imply that any layers, structures, and regions not explicitly shown are omitted from the actual devices or structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional devices or complete package structures. Rather, certain processing steps that are commonly used in forming semiconductor devices and structures are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount. The term "exemplary" as used herein means "serving as an example, instance, or illustration". Any embodiment or design described herein as "exemplary" is not to be construed as preferred or advantageous over other embodiments or designs. The word "over" as used herein to describe forming a feature (e.g., a layer) "over" a side or surface, means that the feature (e.g. the layer) may be formed "directly on" (i.e., in direct contact with) the implied side or surface, or that the feature the layer) may be formed "indirectly on" the implied side or surface with one or more additional layers disposed between the feature (e.g., the layer) and the implied side or surface. The term "wafer-level" as used herein is meant to broadly refer to wafer-level or panel-level.

FIG. 1 schematically illustrates a semiconductor wafer 100 which comprises a plurality of bridge interconnect devices that are formed on a surface of the semiconductor wafer 100. In particular, FIG. 1 shows a schematic top-plan view of the semiconductor wafer 100 having a plurality of bridge modules 110 (e.g., 11 bridge modules), wherein each bridge module 110 comprises the same arrangement of interconnect bridge devices B1, B2, B3, B4, B5, B6, B7, B8, B9, B10, and B11 (or alternatively referred to as bridge chips). In some embodiments, the semiconductor wafer 100 comprises a silicon wafer. In some embodiments, the interconnect bridge devices B1-B11 of the bridge modules 110 are formed using state-of-the-art materials and semiconductor fabrication techniques to obtain target line-width and line-spacing design rules that are suitable for the given application.

For example, in some embodiments, the fine-pitch wiring of the interconnect bridge devices B1-B11 are formed to have sub-micron line-width and line-spacing design rules using back-end-of-line (BEOL) fabrication methods, wherein typical BEOL dielectric and metallic materials are utilized to form the interconnect bridge structures at various regions on the surface of the semiconductor wafer 100. In this regard, each interconnect bridge device B1-B11 comprises multiple layers of inter-level dielectric (ILD) material, and multiple layers of wiring and inter-layer vias, which provide high density die-to-die interconnect wiring for high-bandwidth I/O communication between multiple IC chips connected to the interconnect bridge device and possible redistribution layers to route power/ground connections through the interconnect bridge device from the bottom-side to the top-side of the interconnect bridge device. Each interconnect bridge device B1-B11 comprises a BEOL structure having a stack of signal interconnect and redistribution layers comprising fine pitch signal wires and vertical inter-level vias (e.g., copper wiring and vias) that are formed in multiple ILD layers of dielectric material (e.g., silicon based low-k dielectrics (e.g., k less than about 4.0), porous dielectrics, or other suitable ULK (ultra-low-k) dielectric materials (with k less than about 2.5)).

In some embodiments, some or all of the interconnect bridge devices B1-B11 are fabricated to include active and/or passive devices that are integrated within the BEOL structures. For example, in some embodiments, some or all of the interconnect bridge devices B1-B11 are fabricated to include integrated passive devices, such as resistors, inductors and capacitors, etc., using known techniques. In other embodiments, some or all of the interconnect bridge devices B1-B11 can include active devices (e.g., FET transistors). In other embodiments, some or all of the interconnect bridge devices B1-B11 can include memory elements, e.g., 2-terminal structures based on a cross-point architecture, etc.

Figure 2:
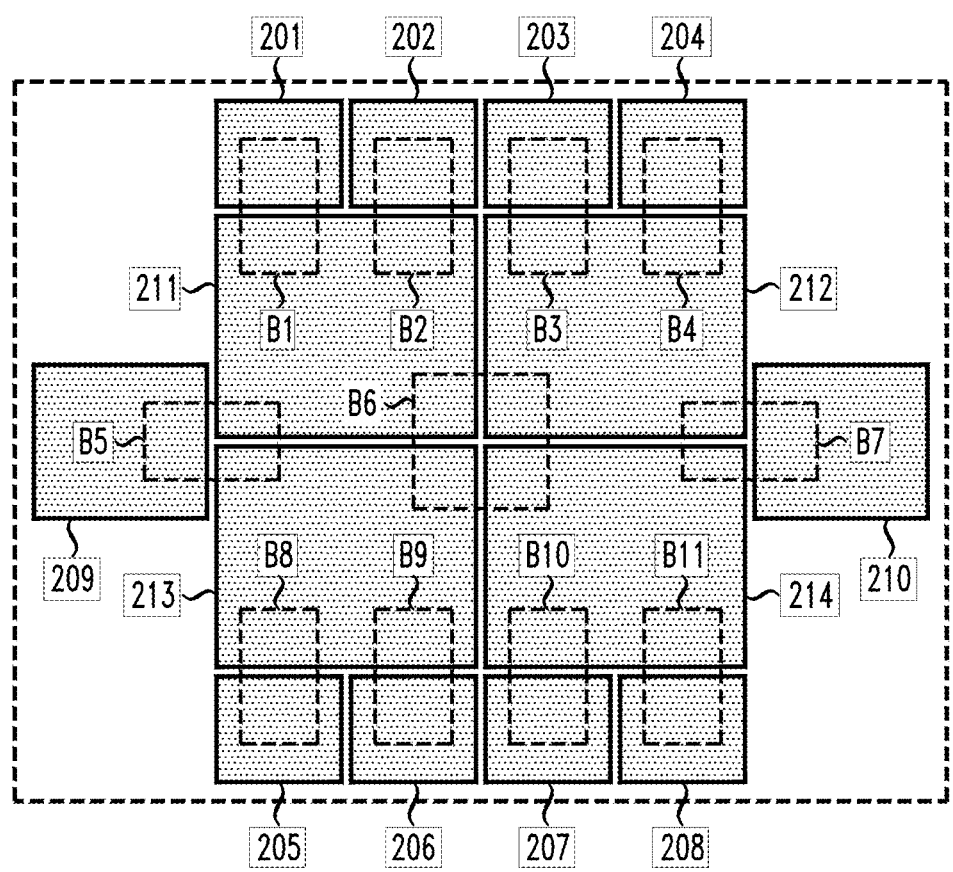
FIG. 2 schematically illustrates a multi-chip module that is formed by joining a plurality of integrated circuit (IC) chips to a plurality of pre-positioned interconnect bridge devices on the semiconductor wafer of FIG. 1.

The semiconductor wafer 100 in FIG. 1 (alternatively referred to as bridge wafer 100) enables wafer-level processing of interconnect bridge devices to form the bridge modules 110 having pre-positioned interconnect bridge chips to which variety types of semiconductor IC chips can be joined to form multi-chip package structures (e.g., system-in-package). For example, FIG. 2 schematically illustrates a multi-chip module 200 that is formed by joining a plurality of IC chips to the interconnect bridge structures B1-B11 within a bridge module 110. In particular, FIG. 2 is a schematic top-plan view of a given bridge module 110 region of the semiconductor wafer 100 of FIG. 1, wherein multiple IC chips 201, 202, 203, 204, 205, 206, 207, 208, 209, 210, 211, 212, 213, and 214 are joined (e.g., via flip-chip solder bump bonding) to the interconnect bridge structures B1-B11 (which are shown in phantom as dashed rectangles).

In particular, as shown in FIG. 2, the IC chips 201 and 211 are joined to the interconnect bridge B1, wherein the interconnect bridge B1 is designed to provide chip-to-chip interconnections between the IC chips 201 and 211. The IC chips 202 and 211 are joined to the interconnect bridge B2, wherein the interconnect bridge B2 is designed to provide chip-to-chip interconnections between the IC chips 202 and 211. The IC chips 203 and 212 are joined to the interconnect bridge B3, wherein the interconnect bridge B3 is designed to provide chip-to-chip interconnections between the IC chips 203 and 212. The IC chips 204 and 212 are joined to the interconnect bridge B4, wherein the interconnect bridge B4 is designed to provide chip-to-chip interconnections between the IC chips 204 and 212. The IC chips 209, 211, and 213 are joined to the interconnect bridge B5, wherein the interconnect bridge B5 is designed to provide chip-to-chip interconnections between the IC chips 209, 211, and 213. The IC chips 211, 212, 213, and 214 are joined to the interconnect bridge B6, wherein the interconnect bridge B6 is designed to provide chip-to-chip interconnections between the IC chips 211, 212, 213, and 214. The IC chips 210, 212, and 214 are joined to the interconnect bridge B7, wherein the interconnect bridge B7 is designed to provide chip-to-chip interconnections between the IC chips 210, 212, and 214. The IC chips 205 and 213 are joined to the interconnect bridge B8, wherein the interconnect bridge B8 is designed to provide chip-to-chip interconnections between the IC chips 205 and 213. The IC chips 206 and 213 are joined to the interconnect bridge B9, wherein the interconnect bridge B9 is designed to provide chip-to-chip interconnections between the IC chips 206 and 213. The IC chips 207 and 214 are joined to the interconnect bridge B10, wherein the interconnect bridge B10 is designed to provide chip-to-chip interconnections between the IC chips 207 and 214. The IC chips 208 and 214 are joined to the interconnect bridge B11, wherein the interconnect bridge B11 is designed to provide chip-to-chip interconnections between the IC chips 208 and 214.

For a heterogeneous packaging application, the IC chips 201, 202, 203, 204, 205, 206, 207, 208, 209, 210, 211, 212, 213, and 214 may comprise many types of integrated circuits to implement, e.g., a computing system for a given application. By way of example, the IC chips 201, 202, 203, 204, 205, 206, 207, and 208 may be memory devices (e.g., high-bandwidth memory (HBM) dynamic random-access memory (DRAM) devices), the IC chips 209 and 210 may be central processing units (CPUs) or other types of I/O devices (high-speed off-module signals), and the IC chips 211-214 may be hardware accelerator devices (e.g., graphics processing unit (GPU) devices). In other embodiments, the IC chips can include one or more of a memory device, a microcontroller, an application-specific integrated circuit (ASIC), a field programmable gate array (FPGA), and other types of general purposes processors or work-load optimized processors such as digital signal processors (DSPs), system-on-chip (SoC), and other types of specialized processors or coprocessors that are configured to execute one or more fixed functions.

Although not specifically shown in FIGS. 1 and 2, prior to joining IC chips to the interconnect bridge devices in the bridge module 110 regions, shallow dicing channels are formed in the surface of the bridge wafer 100 around each of the interconnect bridge devices using techniques such as laser dicing or reactive ion etching (RIE). These dicing channels are formed to a depth that penetrates through the BEM, stack down to, and slightly into, the bulk semiconductor layer of the bridge wafer 100. As explained in further detail below, these dicing channels facilitate the release of the individual interconnect bridge chips during a backside grinding/etching of the bridge wafer 100 which is performed to remove the bulk semiconductor layer on which the wafer-level BEM, structure is formed.

The formation of the bridge wafer 100 with pre-positioned interconnect bridge devices within the bridge modules 110 allows for a spacing between the interconnect bridge devices within each bridge module 110 and an arrangement of the interconnect bridge devices within each bridge module 110 to be precisely controlled and lithographically defined through the BEOL process module. In addition, by coupling the integrated circuit chips (though either a direct chip attachment or through a wafer-level redistribution layer structure) to the pre-positioned interconnect bridge devices prior to release of the interconnect bridge devices from the bridge wafer 100 allows for the fabrication of multi-chip modules having interconnect bridge devices with well-defined spacing and orientation with respect to each other. This is in contrast to conventional methods in which chip-modules are formed by sequentially joining IC chips and interconnect bridges through a pick and place process, wherein the spacing and orientation of the interconnect bridge devices can vary between the same chip-modules.

Figure 3A:
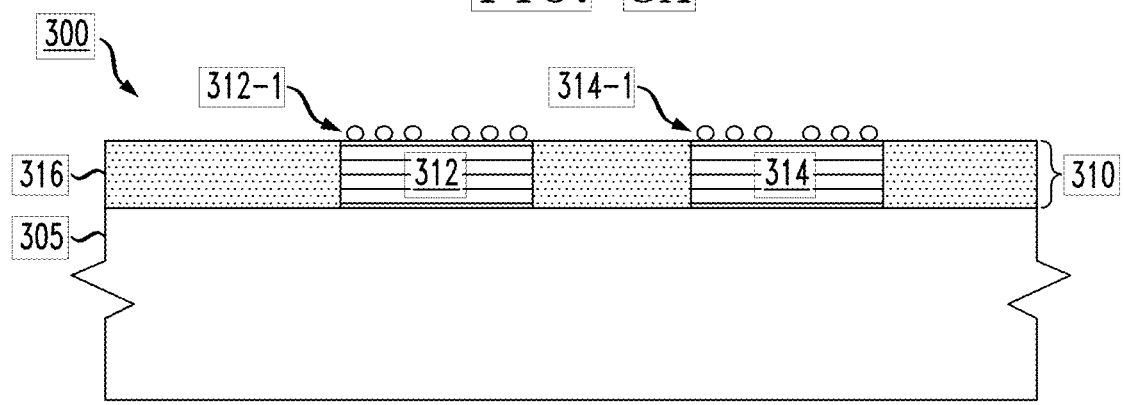

Methods for fabricating multi-chip package structures will now be discussed in further detail with reference to FIGS. 3A-3H, 4A-4E, and 5A-5C, and 6A-6B. For example, FIGS. 3A-3H schematically illustrate a method for constructing a multi-chip package structure by joining IC chips to pre-positioned interconnect bridge devices that are fabricated on a bridge wafer, according to an embodiment of the disclosure. To begin, FIG. 3A is a schematic cross-sectional side view of a bridge wafer 300 comprising a plurality of interconnect bridge devices formed on a surface of the bridge wafer 300. The bridge wafer 300 comprises a semiconductor substrate 305 (e.g., a bulk semiconductor wafer, a semiconductor-on-insulator (SOI) wafer, etc.) and a wafer-level BEOL structure 310 formed on the surface of the semiconductor substrate 305. An SOI wafer includes a buried insulating layer, which can be used in a subsequent backside grind as an etch stop layer.

The wafer-level BEOL structure 310 comprises interconnect bridge devices 312 and 314 embedded in a layer of dielectric material 316. The interconnect bridge devices 312 and 314 each comprise multiple ILD layers having multiple levels of wiring and inter-layer vias which form high density interconnect wiring for chip-to-chip connections. The layer of dielectric material 316 which surrounds the interconnect bridge devices 312 and 314 comprises a stack of ILD layers that are fabricated as part of the BEOL process to form the interconnect bridge devices 312 and 314. In some embodiments, as shown in FIG. 3A, the upper surfaces of the interconnect bridge devices 312 and 314 are terminated with respective arrays of solder bumps 312-1 and 314-1 for joining IC chips to the interconnect bridge devices 312 and 314 in a subsequent stage of fabrication.

Figure 3B:
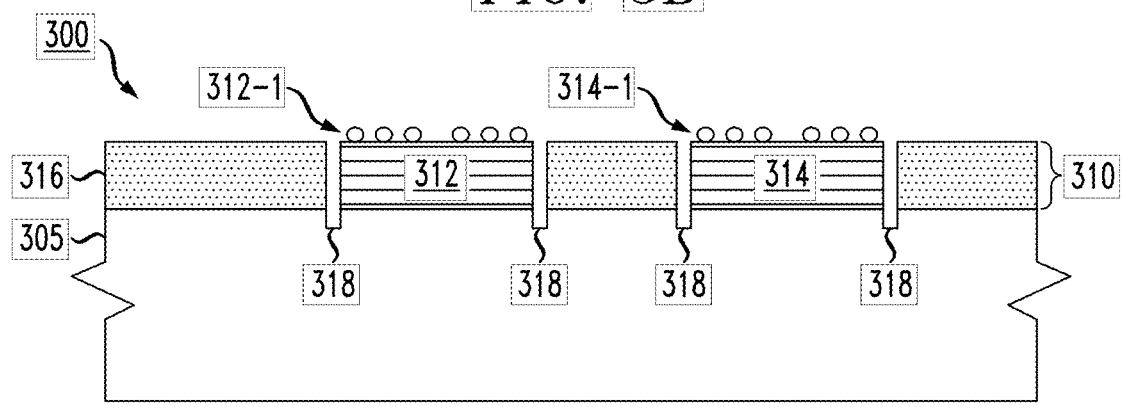

Next, FIG. 3B is a schematic cross-sectional side view of the bridge wafer 300 of FIG. 3A after forming dicing channels 318 in the surface of the bridge wafer 300 around each of the interconnect bridge devices 312 and 314. In some embodiments, the dicing channels 318 are formed using laser dicing techniques. In some embodiments, as shown in FIG. 3B, the dicing channels 318 are formed to a depth which penetrates through the BEOL layer 310 down to, and slightly into, the upper surface of the bulk semiconductor layer 305. The dicing channels 318 facilitate the release of the individual interconnect bridge devices 312 and 314 during a backside grinding/etching of the bridge wafer 300 which is performed to remove the bulk semiconductor substrate layer 305 on which the wafer-level BEOL structure 310 is formed.

Figure 3C:
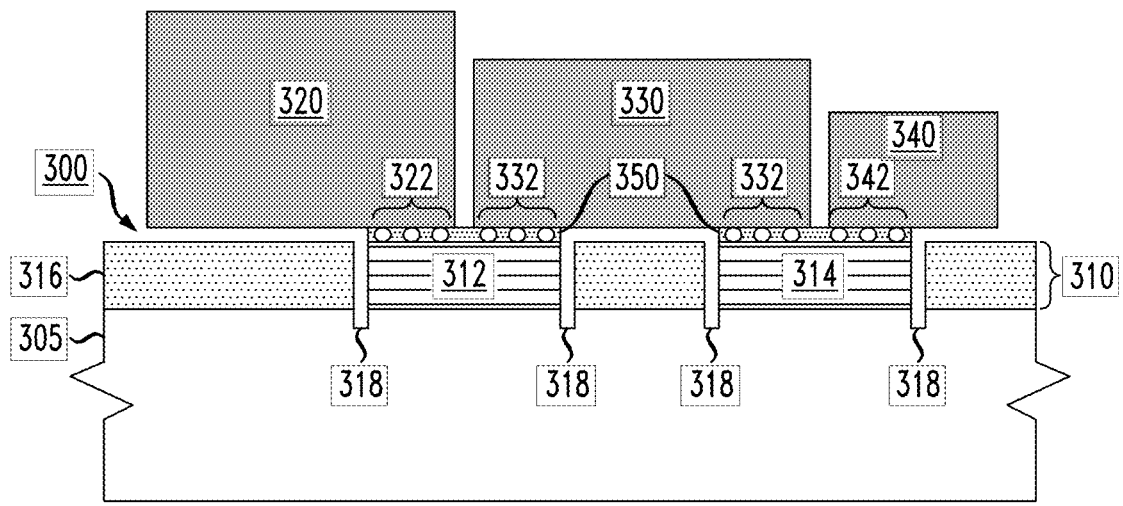

Next, FIG. 3C is a schematic cross-sectional side view of the bridge wafer 300 of FIG. 3B after joining IC chips to the interconnect bridge devices 312 and 314. In particular, FIG. 3C schematically illustrates an intermediate package structure which is constructed by flip-chip bonding a plurality of IC chips 320, 330 and 340 to the interconnect bridge devices 312 and 314 using the solder bumps 312-1 and 314-1 to form respective arrays of solder bump connections 322, 332, and 342. In some embodiments, a sequential join process is performed wherein the IC, chip 320 is bonded face down to the interconnect bridge device 312 (via the solder bump connections 322), wherein the IC chip 330 is bonded face down to both interconnect bridge devices 312 and 314 (via the solder bump connections 332), and wherein the IC chip 340 is bonded face down to the interconnect bridge device 314 (via the solder bump connections 342). The IC chips 320, 330, and 340 can be flip-chip bonded to the interconnect bridge devices 312 and 314 using solder reflow or thermo-compression bonding techniques.

As further shown in FIG. 3C, underfill layers 350 are disposed between the upper surfaces of the interconnect bridge devices 312 and 314 and the overlapping active surfaces of the IC chips 320, 330, and 340. The underfill layers 350 comprise electrically-insulating adhesive material which is utilized to maintain the structural integrity of the solder bump connections 322, 332, and 342 between the respective IC chips 320, 330, and 340, and the upper surfaces of the interconnect bridge devices 312 and 314. In some embodiments, the underfill layers 350 are formed following the flip-chip bonding of the IC chips 320, 330, and 340 using a capillary underfill process to deposit a liquefied underfill material between the IC chips 320, 330, and 340 and the upper surfaces of the interconnect bridge devices 312 and 314, followed by a cure process to harden the underfill material. In other embodiments, the underfill layers 350 may comprise pre-applied underfill layers that are applied on the bumped upper surfaces of the interconnect bridge devices 312 and 314 prior to the flip-chip bonding process. In some embodiments, the underfill layers 350 on can be made of the same material, or different materials, depending on packaging requirements.

As shown in FIG. 3C, the underfill material 350 is not disposed outside the bridge regions. However, in some embodiments, a release layer can be formed between the active surfaces of the IC chips 320, 330, and 340, and the upper surface of the wafer-level BEOL structure 310 outside the bridge regions to provide enhanced mechanical support for end portions of the IC chips 320, 330, and 340 which are not structurally bonded to the interconnect bridge devices 312 and 314. The release layer can be formed of any suitable material which can be readily removed in a subsequent stage of fabrication to expose the portions of the active surfaces of the IC chips 320, 330, and 340 which do not overlap the interconnect bridge devices 312 and 314.

Figure 3D:
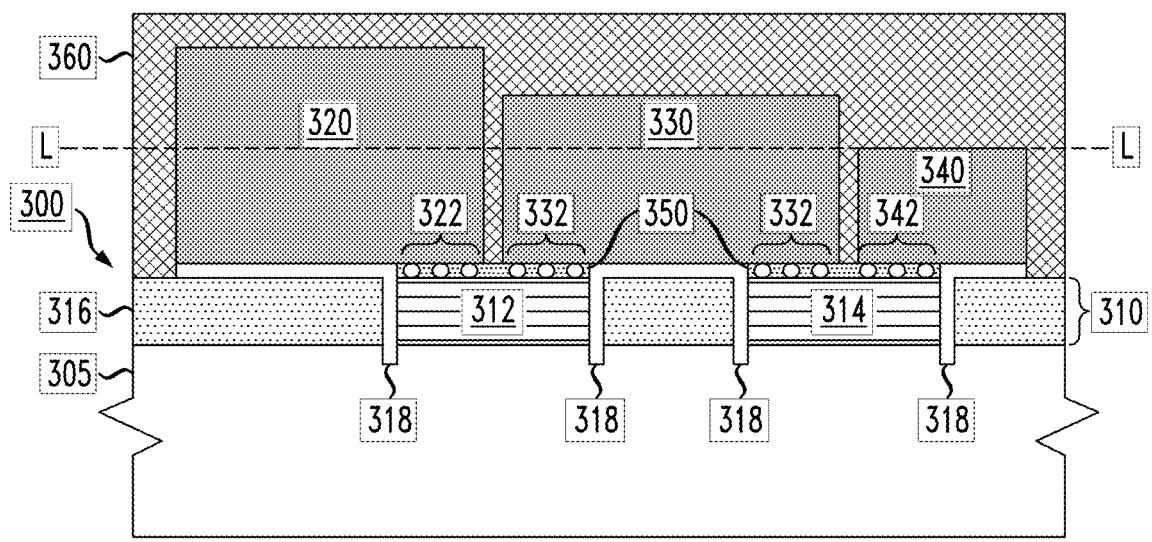

Next, FIG. 3D is a schematic cross-sectional side view of the intermediate structure shown in FIG. 3C after forming a molding layer 360 to encapsulate the IC chips 320, 330, and 340 and cover the exposed portions of the upper surface of the bridge wafer 300. The molding layer 360 can be formed using known materials and techniques. For example, the molding layer 360 may be formed by depositing and curing an epoxy resin material, as is known in the art. As shown in FIG. 3D, the IC chips 320, 330, and 340 have different thicknesses, such that there is different thicknesses of the molding layer 360 above the backside surfaces of IC chips 320, 330, and 340. The molding layer has relatively high thermal resistance which impedes heat transfer from the backside surfaces of the IC chips 320, 330, and 340 to a heat sink, which is thermally bonded to the package structure at a later stage of fabrication.

Figure 3E:
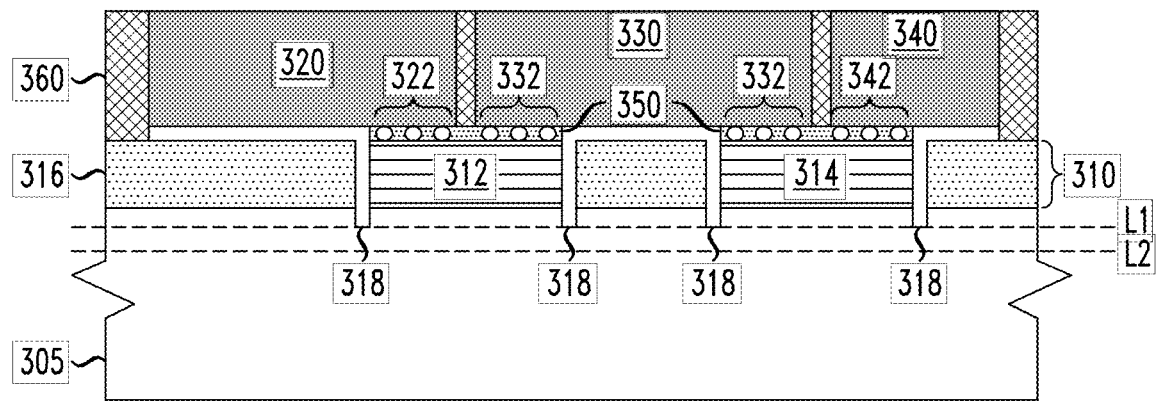

In this instance, it is desirable planarize the upper surface of the intermediate structure shown in FIG. 3D down to, e.g., the dashed line L shown in FIG. 3D, to expose the backsides of the IC chips 320, 330, and 340. For example, FIG. 3E is a schematic cross-sectional side view of the intermediate package structure shown in FIG. 3D after planarizing the upper surface of the molding layer 360 down to expose the backsides of the IC chips 320, 330, and 340. In this exemplary embodiment, the upper surface of the structure is planarized down to expose the backside surface of the thinnest IC chip (e.g., IC chip 340), which results in thinning the other thicker IC chips 320 and 330. As shown in FIG. 3E, the planarizing process results in the IC chips 320, 330 and 340 having the same thickness and with the planarized surface of the molding layer 360 being coplanar with the backside surfaces of the IC chips 320, 330, and 340. The planarizing is possible in instances where the backside thinning of the IC chips 320 and 330 would not result in destruction of the active circuity and other functional elements of the IC chips 320 and 330. The planarizing process can be implemented using, e.g., a mechanical grinding process.

Figure 3F:
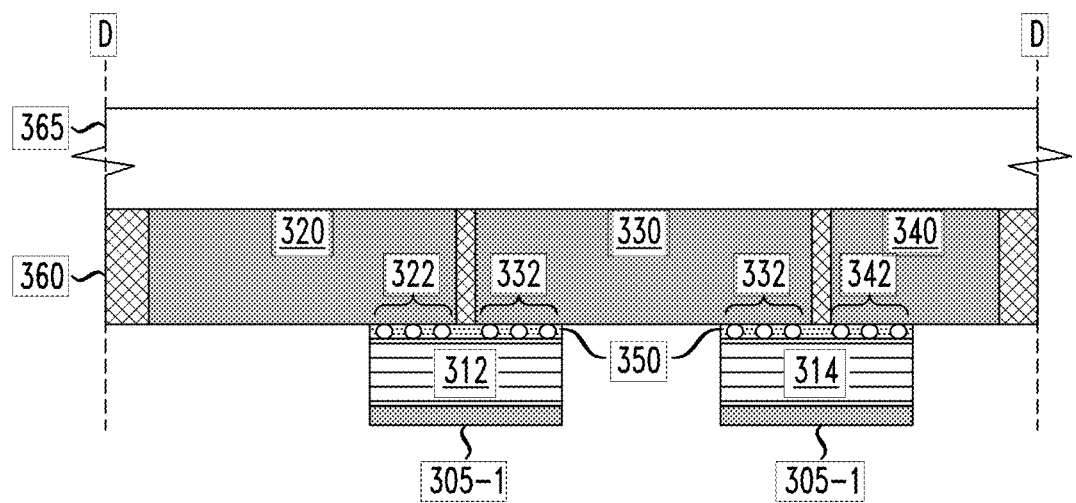

Next, FIG. 3F is a schematic cross-sectional side view of the intermediate package structure shown in FIG. 3E after bonding a handler substrate 365 (e.g., handler wafer) to the planarized backside surfaces of the IC chips 320, 330, and 340 and the molding layer 360, and after performing a backside grind process to remove the semiconductor wafer layer 305 of the bridge wafer 300 and release the individual interconnect bridge devices 312 and 314. In some embodiments, the handler substrate 365 comprises a silicon substrate or glass substrate which is bonded to the upper planarized surfaces using, for example, a releasable adhesive layer.

In some embodiments, the backside grinding of the semiconductor substrate layer 305 is performed using a mechanical grinding process to grind down the semiconductor substrate layer 305 down to a level (denoted by a dashed line L1 in FIG. 3E) which exposes the bottom portions of the dicing channels 318. This backside grinding effectively releases the interconnect bridge devices 312 and 314 from the bridge wafer 300, and allows removal of the remaining portions of the wafer-level BEOL structure 310 outside of the bridge regions to thereby expose those portions of the active surfaces of the IC chips 320, 330, and 340 which are not bonded to the interconnect bridge devices 312 and 314. As shown in FIG. 3F, thin layers of semiconductor material of the semiconductor substrate layer 305-1 may remain on the backside surfaces of the interconnect bridge devices 312 and 314 following the backside grind process. These remaining portions 305-1 may be removed in instances wherein the backside surfaces of the interconnect bridge devices 312 and 314 have contact pads which are to be used to form solder bump connections between the backsides of the interconnect bridge devices 312 and 314 and a package substrate in a subsequent stage of fabrication.

In some embodiments, a "double dicing" process can be implemented to release the interconnect bridge devices 312 and 314 from the bridge wafer 300, and allow removal of the remaining portions of the wafer-level BEOL structure 310 outside of the bridge regions. With this process, the backside grinding process can be performed to a level (denoted by a dashed line L2 in FIG. 3E) before reaching the bottom portions of the dicing channels 318. In some embodiments, a backside plasma etch process is then performed to etch corresponding dicing channels on the thinned backside surface of the semiconductor substrate layer 305 to open the previously formed dicing channels 318 and thereby release the interconnect bridge devices 312 and 314. In other embodiments, the backside dicing can be performed using laser dicing or a dicing saw, etc. The double dicing process reduces mechanical stress that may be applied to the backside surfaces of the interconnect bridge devices 312 and 314 during the backside grinding process.

Following the wafer-level backside grinding of the semiconductor substrate layer 305 of the bridge wafer 300 and the release of the interconnect bridge devices 312 and 314, a dicing process is performed to dice the wafer-level molding layer 360 and thereby separate the individual chip modules (e.g., multi-chip module 200. FIG. 2). In some embodiments, when the IC chips and the wafer-level molding layer 360 are relatively thin, the dicing of the wafer-level molding layer 360 is performed with the wafer handler 365 attached to the wafer-level molding layer 360. In other embodiments, when the IC chips and wafer-level molding layer 360 are relatively thick, the reconstituted wafer structure (which comprises the wafer-level molding layer 360 and multi-chip modules) and associated interconnect bridge devices could be released from the wafer handler 365 onto dicing tape, and then diced to obtain the individual chip modules.

Figure 3G:
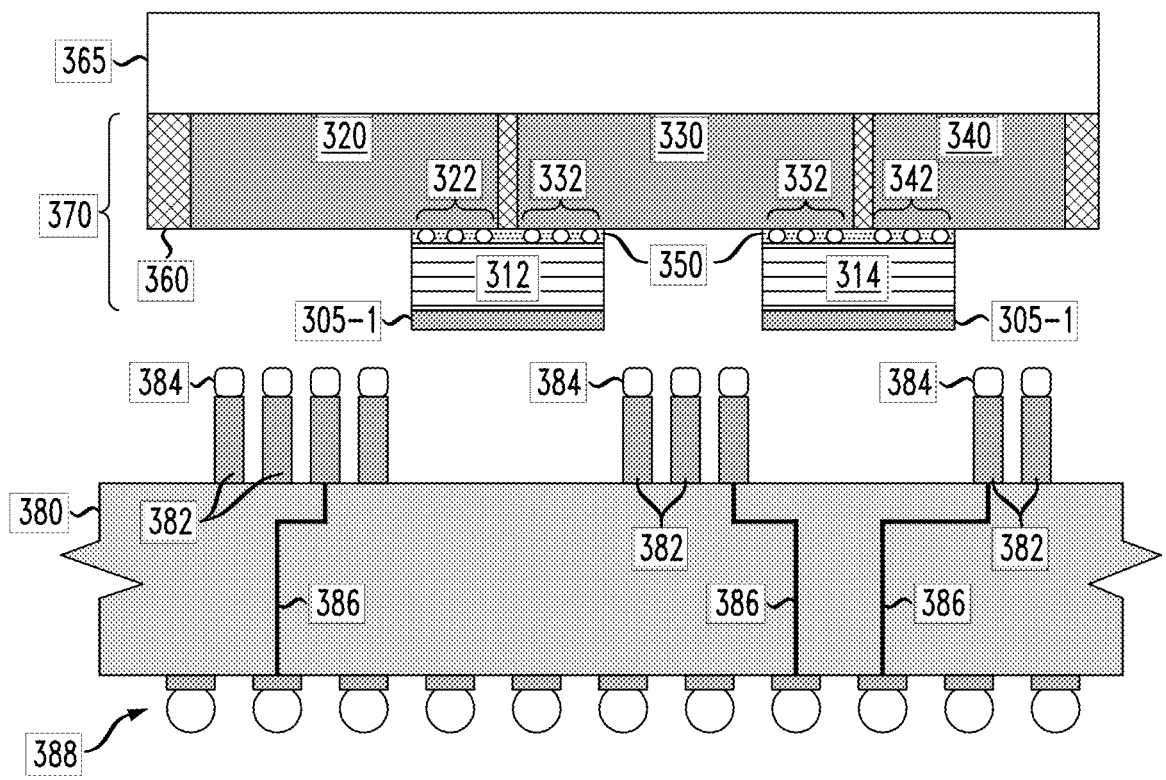

Next, FIG. 3G is a schematic cross-sectional side view of the intermediate wafer-level structure shown in FIG. 3F after dicing the wafer-level structure along dicing lines D (shown as dashed lines in FIG. 3F) to obtain an individual multi-chip module 370, and aligning the multi-chip module 370 to a package substrate 380. In this exemplary embodiment, the individual multi-chip module 370 comprises the IC chips 320, 330, and 340 molded together in the diced portion of the molding layer 360, and the interconnect bridge devices 312 and 314. In some embodiments, the diced portion of the wafer handler 365 is utilized to handle the positioning and mounting of the multi-chip module 370 to the package substrate 380.

In some embodiments, the package substrate 380 comprises metallic pillar structures 382 (e.g. copper pillars) formed on a top side of the package substrate 380. In addition, the metallic pillar structures 382 comprise solder endcaps 384. The package substrate 110 can be a ceramic substrate, a silicon substrate or an organic laminate build-up substrate, or any other type of package substrate technology that is suitable for the given application. The package substrate 380 comprises a network of package traces 386 which vertically and horizontally extend through the package substrate 380, and an area array of solder ball interconnects 388 (e.g., Ball Grid Array (BGA) solder interconnects) disposed on a bottom side of the package substrate 380.

Figure 3H:
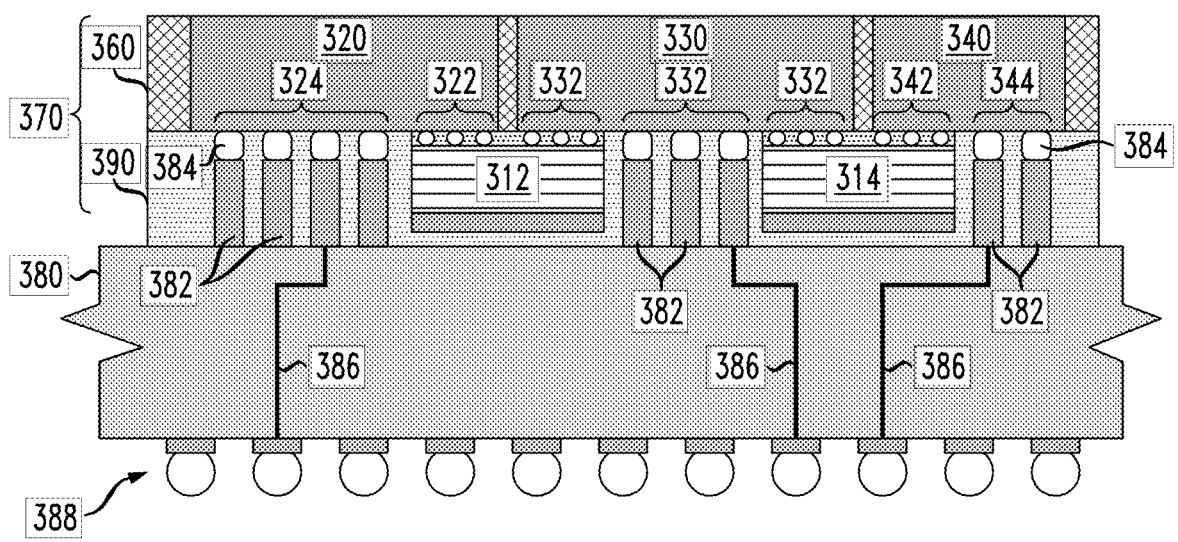

Next, FIG. 3H is a schematic cross-sectional side view of a multi-chip package structure after mounting the multi-chip module 370 to the upper surface of the package substrate 380 and removing the handler 365 from the multi-chip module 370. In particular, FIG. 3H illustrates that the multi-chip module 370 is joined to the package substrate 380 using the solder endcap bumps 384 to bond to contact pads on the exposed active surfaces of the IC chips 320, 330, and 340 to form respective arrays of solder bump connections 324, 334, and 344. The IC chips 320, 330, and 340 can be flip-chip bonded to the solder-capped metallic pillars 382 using solder reflow or thereto-compression bonding techniques.

As further shown in FIG. 3M, an underfill layer 390 is formed between the multi-chip module 370 and the upper surface of the package substrate 380 to encapsulate the interconnect bridge devices 312 and 314 and the solder-capped metallic pillars 382 in an electrically-insulating adhesive material. The underfill layer 390 serves to maintain the structural integrity of the solder bump connections 324, 334, and 344 between the respective IC chips 320, 330, and 340, and the package substrate 380 and provide further structural support for the interconnect bridge devices 312 and 314. In some embodiments, the underfill layer 390 is formed following the joining of the multi-chip module 370 to the package substrate 380 using a capillary underfill process. In some embodiments, the underfill material 390 may comprise different layers of adhesive material, wherein a first layer of underfill material is used in the regions of the interconnect bridge devices 312 and 314 to fixedly bond the interconnect bridge devices 312 and 314 to the package substrate 380, and wherein an additional layer of underfill material is used to encapsulate the solder-capped metallic pillars 382/384.

In some embodiments, the arrays of solder bump connections 322, 332, and 342 comprise micro-bump connections that are formed with a contact pitch of about 55 microns or less, depending on the application. In some embodiments, the arrays of solder bump connections 324, 334, and 344 are coarser in pitch than the micro-bump connections 322, 332, and 342. For example, in some embodiments, the arrays of solder bump connections 324, 334, and 344 are formed with a contact pitch of about 75 microns or greater, depending on the application. In other embodiments, one or more of the arrays of solder bump connections 324, 334, and 344 can be formed with a fine pitch (.g., 55 um or less). In other embodiments, the arrays of solder bump connections 324, 334, and 344 can have different contact pitches (e.g., solder bump array 334 can be fine-pitched whereas solder bump arrays 324 and 344 can be coarse-pitched, etc.). In other embodiments, some or all of the solder bump arrays 324, 34, and 344 can have mixed pitch bumps (fine pitch and coarse pitch bumps). In some embodiments, the solder ball connections 388 (e.g., BGA) on the bottom side of the package substrate 380 are formed with a contact pitch of about 100 microns or greater, depending on the application.

While the solder bump connections 322, 332, and 342 are generically illustrated in FIG. 3H for ease of illustration, it is to be understood that the solder bump connections 322, 332, and 342 can be implemented using any suitable flip-chip bump technology. For example, the solder bump connections 322, 332, and 342 can be implemented using controlled collapse chip connection (C4) flip-chip bump technology where solder balls are formed on ball limiting metallurgy (BLM) pads or under bump metallization (UBM) pads. The solder balls can be formed by solder paste printing or electroplating. In other embodiments, solder bump connections 322, 332, and 342 can be chip connection (C2) bumps comprising metallic pillar structures (e.g. copper pillars) that are formed on metal pads on the upper surfaces of the interconnect bridge devices 312 and 314. The metallic pillar bump structures may or may not have solder endcaps. In other embodiments, the older bump connections 322, 332, and 342 can be C2 bumps with plated metal formed on UBM pads.

Figure 4A:
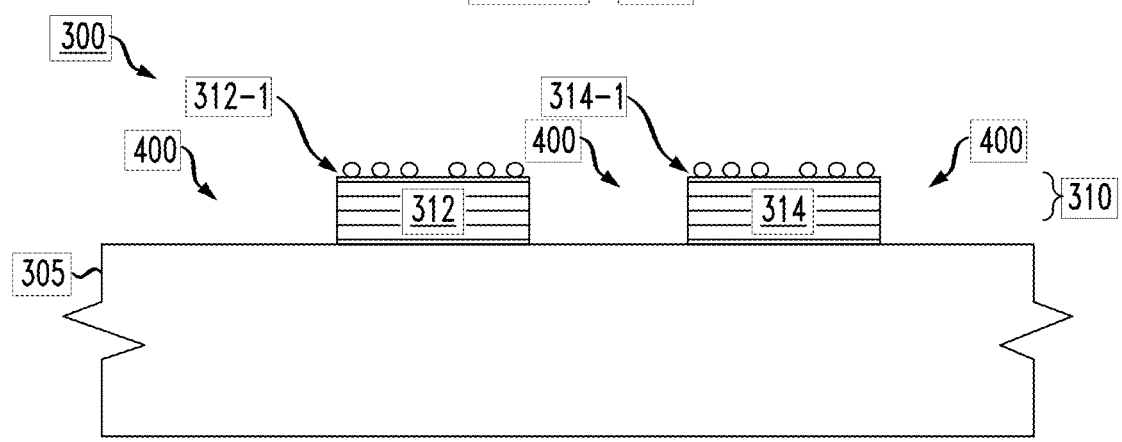

FIGS. 4A-4E schematically illustrate a method for constructing a multi-chip package structure according to another embodiment of the disclosure. In particular, FIGS. 4A-4E schematically illustrate a method for constructing a multi-chip package structure by joining IC chips to pre-positioned interconnect bridge devices that are fabricated on a bridge wafer, according to another embodiment of the disclosure. To begin, FIG. 4A is a schematic cross-sectional side view of the bridge wafer 300 of FIG. 3A after etching trenches 400 in the wafer-level BEOL structure 310 surrounding the interconnect bridge devices 312 and 314. Essentially, the etch trench process results in the removal of all or most of the dielectric material 318 of the BEOL structure 310 surrounding the interconnect bridge devices 312 and 314 and surrounding other bridge devices of other bridge modules across the bridge wafer 300. The formation of the trenches is an alternative embodiment to forming the dicing channels 318 as shown in FIG. 3B. The etch process can be implemented using standard photolithographic patterning and dry etch processes (e.g., reactive ion etch (RIE)).

Figure 4B:
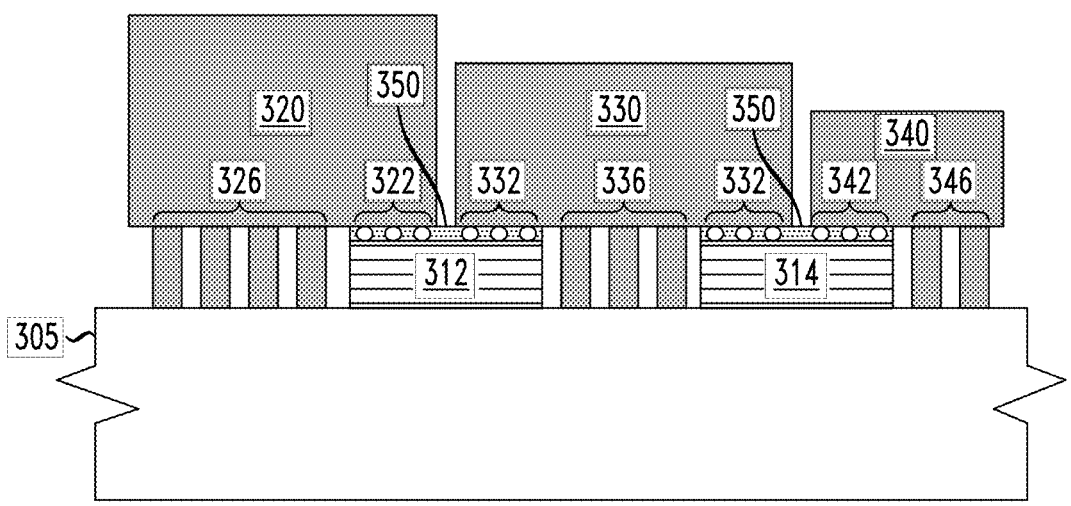

The upper surfaces of the interconnect bridge devices 312 and 314 are terminated with respective arrays of solder bumps 312-1 and 314-1 for joining the IC chips to the interconnect bridge devices 312 and 314, as shown in FIG. 4B. In particular, FIG. 4B is a schematic cross-sectional side view of the bridge wafer 300 of FIG. 4A after joining the IC chips 320, 330, and 340 to the interconnect bridge devices 312 and 314 using the solder bumps 312-1 and 314-1 to form the respective arrays of solder bump connections 322, 332, and 342. In some embodiments, the IC chips 320, 330, and 340 are sequentially joined to the interconnect bridges 312, and 314 using the same or similar methods as discussed above in conjunction with FIG. 3C. In addition, the underfill layers 350 are formed to encapsulate the solder bump connections 322, 332, and 342 between the IC chips 320, 330, and 340 and the interconnect bridge devices 312 and 314.

As further shown in FIG. 413, the IC chips 320, 330, and 340 comprise respective area arrays of metallic pillars 326, 336, and 346 (e.g., copper pillars) which are formed on regions of the active surfaces of the IC chips 320, 330, and 340 outside the bridge regions. In this embodiment, the metallic pillars 326, 336, and 346 are formed on the active surfaces of the respective IC chips 320, 330, and 340 prior to joining the IC chips 320, 330, and 340 to the bridge wafer 300. When the IC chips 320, 330, and 340 are joined to the interconnect bridge devices 312 and 314, the metallic pillars 326, 336, and 346 will be disposed in the etched trench regions 400 of the wafer-level BEOL structure 310. As shown in FIG. 4B, in some embodiments, the metallic pillars 326, 336, and 346 are formed with a vertical height such that the end portions of the metallic pillars 326, 336, and 346 are disposed near or in contact with the etched surface of the semiconductor substrate layer 305 after the IC chips 320, 330, and 340 are joined to the interconnect bridge devices 312 and 314. The end portions of the metallic pillars 326, 336, and 346 are exposed and solder-bumped at later stage of fabrication after performing a backside grind process to remove the semiconductor substrate layer 305.

Figure 4C:
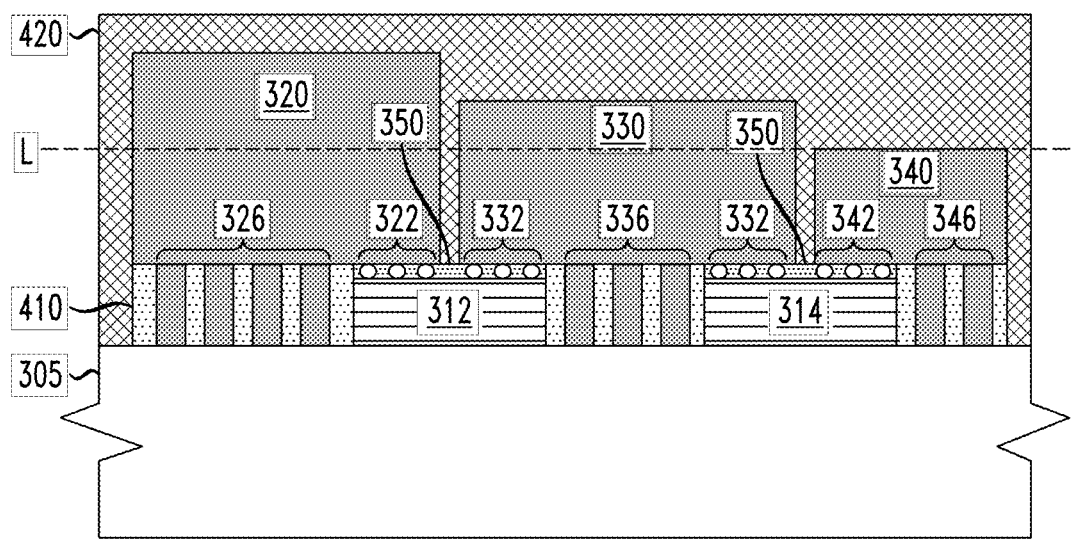

Next, FIG. 4C is a schematic cross-sectional side view of the structure shown in FIG. 4B after forming an underfill layer 410 to encapsulate the metallic pillars 326, 336 and 346 and the bridge devices 312 and 314 in an adhesive underfill material, and after forming a molding layer 420 (e.g., epoxy) to encapsulate the IC chips 320, 330, and 340 and cover the exposed portions of the upper surface of the semiconductor substrate layer 305 of the bridge wafer 300. The underfill layer 410 can be formed using an adhesive material which is the same as or different from the material that is used to form the underfill layers 350.

Figure 4D:
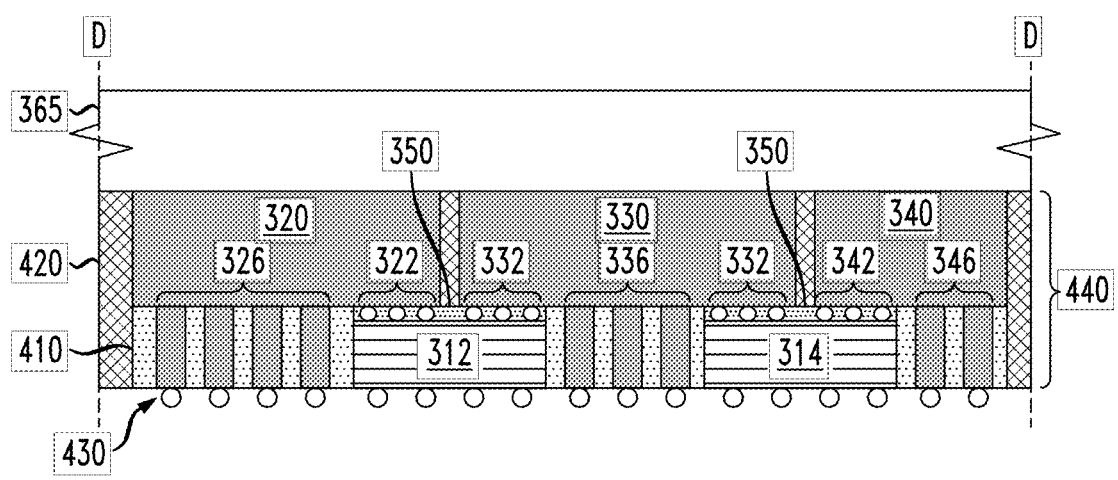

Next, FIG. 4D is a schematic cross-sectional side view of the structure shown in FIG. 4C after (i) planarizing the upper surface of the structure to thin down the molding layer 420 and to make the backside surfaces of the IC chips 320, 330, and 340 coplanar, (ii) bonding a temporary wafer handler 365 to the planarized surface of the structure, (iii) removing the semiconductor substrate layer 305 to release the interconnect bridge devices 312 and 314, and after (iv) forming solder bumps 430 on the exposed ends of the metallic pillars 326, 336, and 346, and on the exposed bottom surfaces of the interconnect bridge devices 312 and 314. In some embodiments, the planarizing process is performed using chemical-mechanical polishing (CMP), or a combination of RIE, wet etching, grinding, CMP, etc. As noted above, the upper surface of the structure is planarized down to etch the backside surfaces of the thicker IC chips 320 and 330 so that the backside surfaces of the IC chips 320, 330 and 340 are coplanar with no molding material disposed above the backsides of the IC chips 320, 330, and 340.

The handler substrate 365 (e.g., silicon or glass handler wafer) is bonded to the planarized backside surfaces of the IC chips 320, 330, and 340 and the molding layer 420 using a releasable adhesive layer. The handler substrate 365 provides mechanical support to enable backside grinding to remove the semiconductor substrate layer 305 of the bridge wafer 300 and release the individual interconnect bridge devices 312 and 314. In some embodiments, the backside grinding is performed using a mechanical grinding process to grind away the semiconductor substrate layer 305 and thereby expose the end portions of the metallic pillars 326, 336, and 346, and the bottom surfaces of the interconnect bridge devices 312 and 314. The solder bumps 430 are then formed on the end portions of the metallic pillar structures 326, 336, and 346, and on contact pads exposed on the backside surfaces of the interconnect bridge devices 312 and 314. In other embodiments, one or more backside redistribution layers or other backside metallization patterns/structures can be formed on the bottom side of the wafer-level chip module prior to forming the solder bumps 430, wherein the solder bumps 430 are formed on contact pads of the backside metallization.

Following the formation of the solder bumps 430, a dicing process is performed to dice the wafer-level molding layer 420 and thereby separate the individual chip modules (e.g., multi-chip module 200, FIG. 2) of the bridge wafer 300. For example, the wafer-level structure shown in FIG. 4D is diced along the dashed lines D to obtain an individual multi-chip module 440. In this exemplary embodiment, the individual multi-chip module 440 comprises the IC chips 320, 330, and 340 molded together in the diced portion of the molding layer 420, and the interconnect bridge devices 312 and 314. In some embodiments, the wafer handler 365 remains bonded to the wafer-level molding layer 420 during the dicing process such that the diced portion of the wafer handler 365 is utilized to handle the positioning and mounting of the multi-chip module 440 to a package substrate.

Figure 4E:
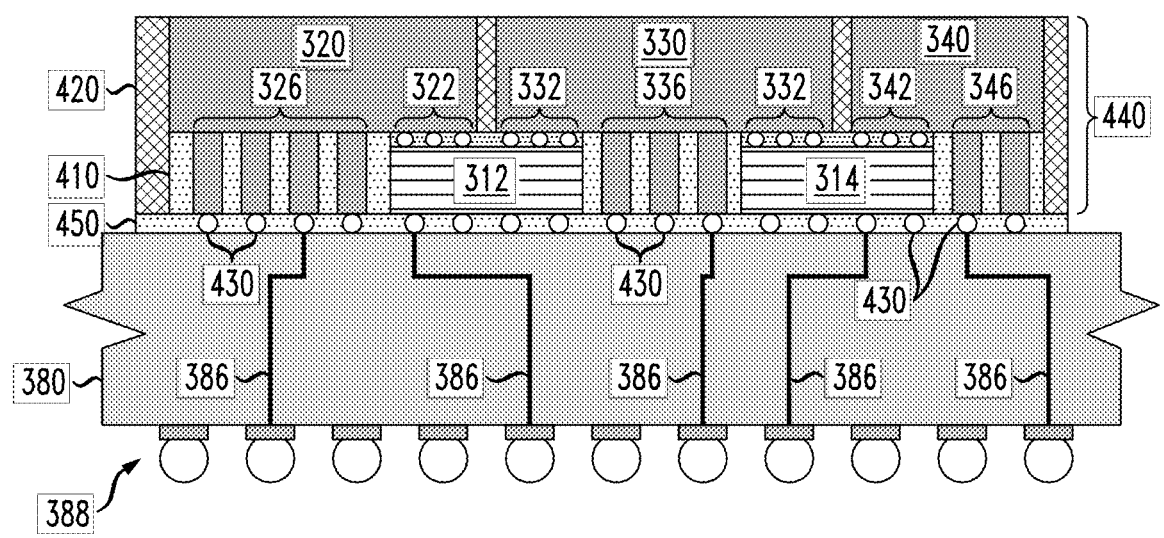

Next, FIG. 4E is a schematic cross-sectional side view of a multi-chip package structure which is formed by joining the multi-chip module 440 to an upper surface of a package substrate 380 and then removing the handler 365 from the upper surface of the multi-chip module 440. In particular, FIG. 4E illustrates that the multi-chip module 440 is joined to the package substrate 380 using the solder bump connections 430, wherein the joining is performed using solder reflow or thermo-compression bonding techniques. As further shown in FIG. 4E, an underfill layer 450 is formed between the multi-chip module 440 and the upper surface of the package substrate 380 to encapsulate the solder bump connections 430 an electrically-insulating adhesive material. The underfill layer 450 serves to maintain the structural integrity of the solder bump connections 430 between the multi-chip module 440 and the package substrate 380. In some embodiments, the underfill layer 450 is formed following the joining of the multi-chip module 440 to the package substrate 380 using a capillary underfill process. In some embodiments, the underfill material 450 comprises different layers of adhesive underfill material, wherein a first layer of underfill material is disposed in the regions of the interconnect bridge devices 312 and 314, and wherein a second layer of underfill material is used outside the bridge regions.

The package substrate 380 comprises a network of package traces 386 which vertically and horizontally extend through the package substrate 380, and an area array of solder ball interconnects 388 (e.g., BGA solder interconnects). In the exemplary embodiment of FIG. 4E, the interconnect bridge devices 312 and 314 are designed to provide vertical power/ground distribution through the bridge devices 312 and 314 to power/ground pads that are disposed within the high-density I/O area arrays 322, 332 and/or 342 of the respective IC chips 320, 330, and 340 which are overlapped by the interconnect bridge devices 312 and 314. As such, connections to such power/ground pads within the high-density I/O area arrays 322, 332 and/or 342 of the IC chips 320, 330, and 340 can be made directly from package-to-die through the interconnect bridge devices 312 and 314.

Figure 5A:
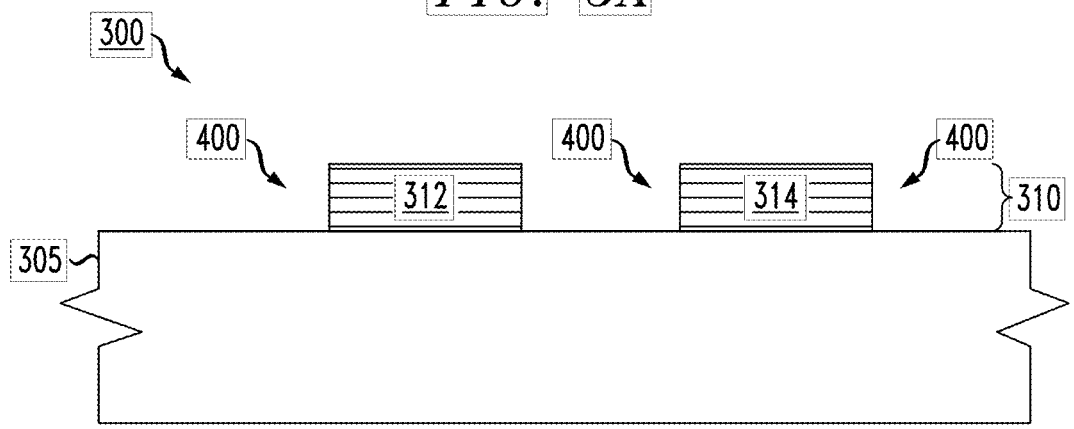
Figure 5B:
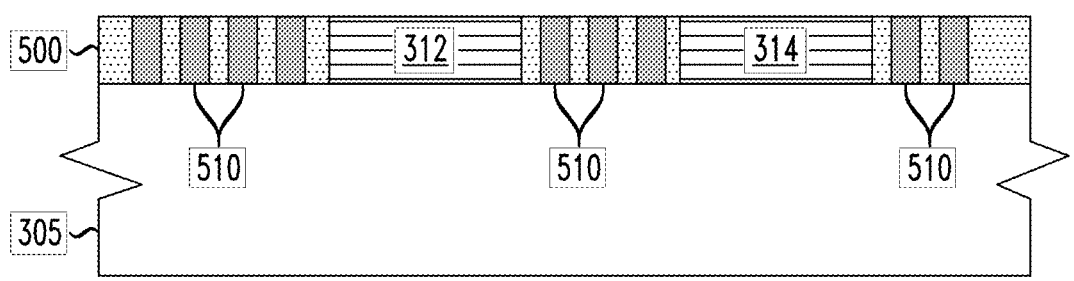
Figure 5C:
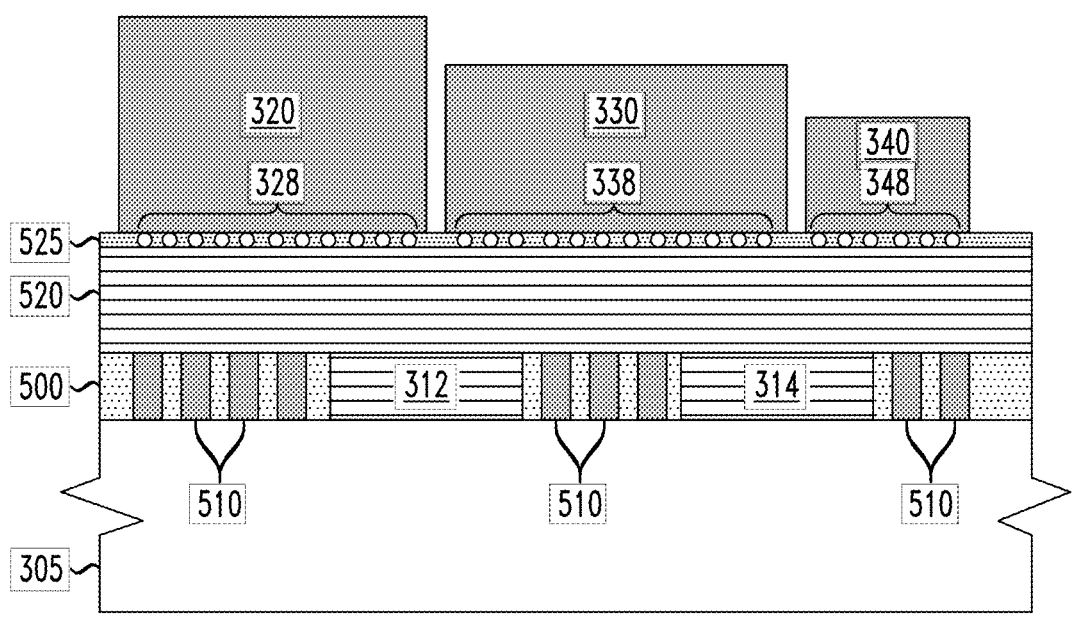

FIGS. 5A-5C schematically illustrate a method for constructing a multi-chip package structure according to another embodiment of the disclosure. In particular, FIGS. 5A-5C schematically illustrate a method for constructing a multi-chip package structure by forming a wafer-level redistribution layer (RDL) structure on a bridge wafer having pre-positioned interconnect bridge devices, and joining a plurality of IC chips to the wafer-level RDL structure, To begin, FIG. 5A is a schematic cross-sectional side view of the bridge wafer 300 of FIG. 3A after etching trenches 400 in the wafer-level BEOL structure 310 surrounding the interconnect bridge devices 312 and 314. Essentially, the etch trench process results in the removal of all or most of the dielectric material 316 of the BEOL structure 310 surrounding the interconnect bridge devices 312 and 314 and surrounding other bridge devices of other bridge modules across the bridge wafer 300. The formation of the trenches is an alternative embodiment to forming the dicing channels 318 as shown in FIG. 3B. The etch process can be implemented using standard photolithographic patterning and dry etch processes (e.g., reactive ion etch (RIE)). The embodiment of FIG. 5A differ from that shown in FIG. 3A in that the upper surfaces of the interconnect bridge devices 312 and 314 are not terminated with respective arrays of solder bumps 312-1 and 314-1 for joining the IC chips to the interconnect bridge devices 312 and 314. Instead, as explained in further detail below, a wafer-level RDL structure is formed on the upper surfaces of the interconnect bridge devices 312 and 314 in a subsequent processing stage.

Next, FIG. 5B is a schematic cross-sectional side view of the bridge wafer 300 of FIG. 5B after forming an insulating layer 500 to encapsulate the interconnect bridge devices 312 and 314, and forming vertical interconnects 510 in the insulating layer 500 outside of the bridge regions. The insulating layer 500 can be formed of any type of insulating material, e.g., dielectric layers, laminated layer, photo-sensitive material, etc., which is suitable for the give application. The insulating layer 500 is formed to planarize the upper surfaces of the bridge wafer 300.

In some embodiments, the vertical interconnects 510 comprise metallic vias that are formed by a process which comprises patterning the insulating layer 500 to form via openings, and then filling the via openings with metallic material, such as copper, to form the metallic vias. In other embodiments, the vertical interconnects 510 comprises metallic pillar structures which are formed on the surface of the semiconductor substrate layer 305 in the trench regions 400 prior to forming the insulating layer 500. In this instance, the insulating layer 500 is deposited to fill the trench regions 400 and encapsulate the vertical interconnects 510.

Next, FIG. 5C is a schematic cross-sectional side view of the structure of FIG. 5B after forming a wafer-level RDL, structure 520 on the over the bridge wafer 300 and after joining the IC chips 320, 330 and 340 to the upper surface of the wafer-level RDL structure 520. In some embodiments, the wafer-level RDL structure 520 comprises a build-up structure of multiple insulating layers and metallization (wiring and vias) to provide redistribution wiring (e.g., fan-out wiring) which is configured to routes I/O signals and power/ground connections between the IC chips 320, 330 and 340 and the interconnect bridge devices 312 and 314 and the vertical interconnections 510.

The wafer-level RDL structure 520 may be fabricated using known materials and techniques. For example, the wafer-level RDL structure 520 may comprise a build-up of organic laminate layers that are formed using standard organic laminate build-up layers in which the insulating layers are formed of an organic material (e.g. polyimide, FR4, etc.), or any suitable dielectric or polymer material which is typically used to form wafer-level RDL fan-out and fan-in structures. The insulating layers are sequentially deposited and patterned to form openings that are filled with metallic material (e.g., copper) to form metallization structures (e.g., lateral wiring and inter-level vias, etc.). The use of organic build-up layers facilitates the fabrication of thick wiring and interconnects for the purpose of power distribution through the RDL structure 520. In other embodiments, the wafer-level RDL, structure 520 can be fabricated using fine-pitch organic redistribution layers to provide greater wiring density for I/O redistribution as needed. In other embodiments, the wafer-level RDL structure 520 can be fabricated using standard. BEOL fabrication methods, with more relaxed design rules than the BEOL processes that are used, for example, to fabricate the interconnect bridge devices 312 and 314.

As further shown in FIG. 5C, the IC chips 320, 330 and 340 are flip-chip mounted to the upper surface of the wafer-level RDL structure 520 using respective arrays of solder bump connections 328, 338 and 348 (e.g., C4s, micro bumps, mixed-pitch solder bump array etc.), wherein the arrays of solder bumps are initially formed on the active (front side) surfaces of the IC chips 320, 330, and 340. A layer of underfill material 525 is formed to encapsulate the solder bump connections 328, 338 and 348. Following fabrication of the intermediate structure shown in FIG. 5C, the same or similar processing steps as discussed above in conjunction with FIGS. 4C, 4D and 4E are performed to fabricate a multi-chip module (comprising the IC chips 320, 330, 340, a diced portion of the wafer-level RDL structures 520, the bridge devices 312 and 313, and the vertical interconnections 510) which is mounted to a package substrate to form a multi-chip package structure.

Figure 6A:
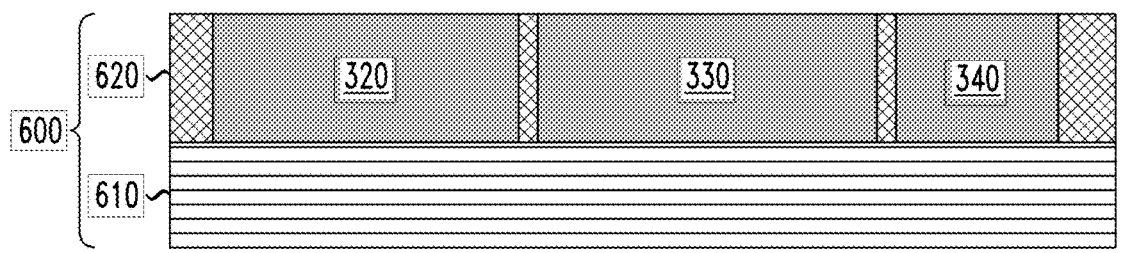
Figure 6B:
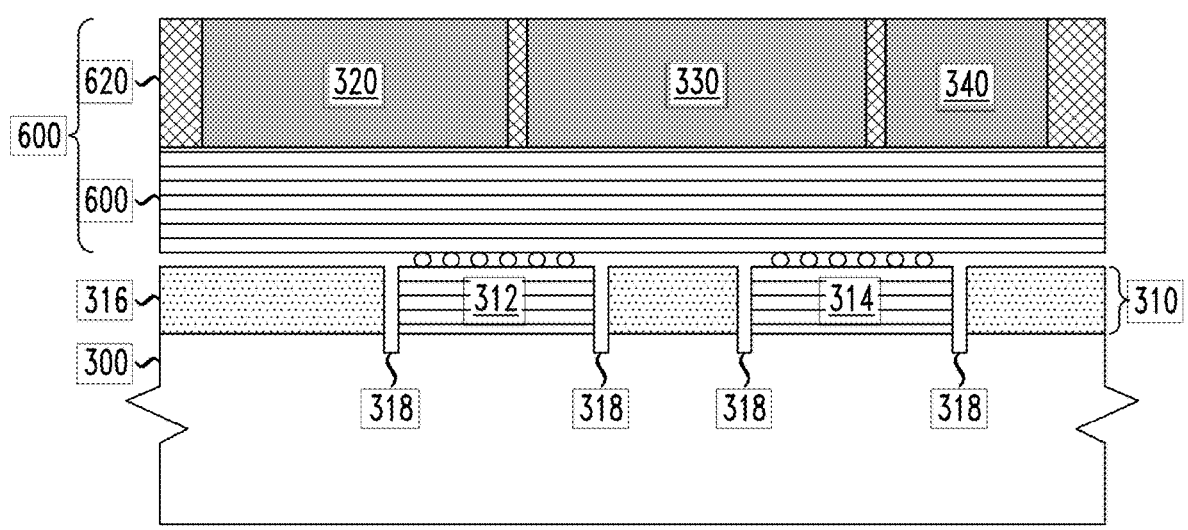

FIGS. 6A and 6B schematically illustrate a method for constructing a multi-chip package structure according to another embodiment of the disclosure, which involves forming a wafer-level chip package structure and joining the wafer-level chip package structure to a bridge wafer having pre-positioned interconnect bridge devices. In particular, FIGS. 6A and 6B schematically illustrate a method which comprises: (i) forming a wafer-level chip package structure comprising a wafer-level redistribution layer structure, a plurality of integrated circuit chips disposed on a surface of the wafer-level redistribution layer structure, and a molding layer formed on the surface of the wafer-level redistribution layer structure encapsulating the integrated circuit chips; (ii) joining the wafer-level chip package structure to a bridge wafer, wherein the bridge wafer comprises a plurality of pre-positioned interconnect bridge devices, and wherein joining the wafer-level chip package structure to the bridge wafer comprises bonding a bottom surface of the wafer-level redistribution layer structure to the interconnect bridge devices using solder bump connections; (iii) releasing the interconnect bridge devices from the bridge wafer; and (iv) dicing the wafer-level chip package structure to form a plurality of individual multi-chip modules.

To begin, FIG. 6A is a schematic cross-sectional side view of a wafer-level chip package structure 600 comprising a wafer-level RDL structure 610, a plurality of IC chips 320, 330, and 340, and a molding layer 620. In the exemplary embodiment of FIG. 6A, the wafer-level chip package structure 600 is fabricated using an "RDL last" technique in which the multiple IC chips 320, 330, and 340 (and other IC chips not shown) are first encapsulated the wafer-level molding layer 620, and the wafer-level RDL structure 610 is formed direction on the active surfaces of IC chips 320, 330, and 340. In other embodiments, a wafer-level chip package structure is formed using a "RDL first" technique in which the wafer-level RDL structure 610 is first formed on a temporary carrier, and the IC chips 320, 330, and 340 are flip-chip connected to the wafer-level RDL structure using solder bump connections.

Next, FIG. 6B is a schematic cross-sectional side view of a package structure which is formed by joining the wafer-level chip package structure 600 to the bridge wafer of FIG. 3B. Following fabrication of the intermediate structure shown in FIG. 6B, the same or similar processing steps as discussed above in conjunction with FIGS. 3E, 3F, 3G, and 3H are performed to fabricate a multi-chip module (comprising a diced portion of the multi-chip package structure 600 and the bridge devices 312 and 314) which is mounted to the package substrate of FIG. 3G, for example, to form a multi-chip package structure.

Although exemplary embodiments have been described herein with reference to the accompanying figures, it is to be understood that the disclosure is not limited to those precise embodiments, and that various other changes and modifications may be made therein by one skilled in the art without departing from the scope of the appended claims.

We claim:

1. A method for constructing a package structure, comprising:

mounting a plurality of integrated circuit chips to a bridge wafer comprising a plurality of pre-positioned interconnect bridge devices, wherein at least two integrated circuit chips are joined to each interconnect bridge device, and wherein each interconnect bridge device comprises wiring to provide chip-to-chip connections between the integrated circuit chips connected to the interconnect bridge device;

forming a wafer-level molding layer on the bridge wafer to encapsulate the plurality of integrated circuit chips mounted to the bridge wafer;

releasing the interconnect bridge devices from the bridge wafer; and dicing the wafer-level molding layer to form a plurality of individual multi-chip modules.

2. The method of claim 1, wherein mounting the plurality of integrated circuit chips to the bridge wafer comprises flip-chip bonding the integrated circuit chips to the interconnect bridge devices using solder bumps formed on upper surfaces of the interconnect bridge devices.

3. The method of claim 1, wherein the bridge wafer comprises a semiconductor wafer and a back-end-of-line structure formed on the semiconductor wafer, wherein the interconnect bridge devices are formed within regions of the back-end-of-line structure.

4. The method of claim 3, wherein releasing the interconnect bridge devices from the bridge wafer comprises backside grinding the semiconductor wafer of the bridge wafer.

5. The method of claim 4, wherein the bridge wafer comprises dicing channels formed through the back-end-of-line structure and into an upper surface of the semiconductor wafer, wherein the dicing channels are formed to surround the pre-positioned interconnect bridge devices on the bridge wafer, and wherein the backside grinding of the semiconductor wafer of the bridge wafer is performed to grind down the semiconductor wafer and expose a bottom of the dicing channels.

6. The method of claim 4, wherein the bridge wafer comprises trenches that are etched in the back-end-of-line structure around the pre-positioned interconnect bridge devices of the bridge wafer, and wherein the backside grinding of the semiconductor wafer of the bridge wafer is performed to grind away the semiconductor wafer and expose bottom surfaces of the interconnect bridge devices.

7. The method of claim 1, wherein forming the wafer-level molding layer on the bridge wafer to encapsulate the plurality of integrated circuit chips mounted to the bridge wafer, comprises:
   depositing a layer of molding material over the plurality of integrated circuit chips; and
   performing a planarizing process to remove the molding material above backsides of the integrated circuit chips and grind down the backsides of at least some of the integrated circuit chips to make the backsides of the integrated circuit chips coplanar.

8. The method of claim 1, further comprising joining at least one individual multi-chip module to a package substrate to form a multi-chip package structure.

9. The method of claim 8, wherein joining the at least one individual multi-chip module to the package substrate comprises bonding exposed portions of active surfaces of the integrated circuit chips of the multi-chip module to solder-capped metallic pillars formed on a surface of the package substrate.

* * * * *